(12) United States Patent
Uozumi et al.

(10) Patent No.: US 7,884,027 B2
(45) Date of Patent: Feb. 8, 2011

(54) METHOD OF MANUFACTURING SEMICONDUCTOR DEVICE

(75) Inventors: Yoshihiro Uozumi, Yokohama (JP); Takashi Hirayama, Oita (JP); Akira Kugita, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1101 days.

(21) Appl. No.: 11/589,979

(22) Filed: Oct. 31, 2006

(65) Prior Publication Data

US 2007/0105378 A1 May 10, 2007

(30) Foreign Application Priority Data

Oct. 31, 2005 (JP) ............... 2005-317704

(51) Int. Cl.
*H01L 21/302* (2006.01)

(52) U.S. Cl. ............... 438/745; 438/749; 134/1.3

(58) Field of Classification Search ............... None
See application file for complete search history.

(56) References Cited

U.S. PATENT DOCUMENTS

| | | | | |
|---|---|---|---|---|
| 5,858,813 | A * | 1/1999 | Scherber et al. ............. | 438/693 |
| 6,235,693 | B1 * | 5/2001 | Cheng et al. ............. | 510/175 |
| 6,248,704 | B1 * | 6/2001 | Small et al. ............. | 510/176 |
| 6,323,169 | B1 * | 11/2001 | Abe et al. ............. | 510/176 |
| 6,916,772 | B2 * | 7/2005 | Zhou et al. ............. | 510/201 |
| 7,135,445 | B2 * | 11/2006 | Charm et al. ............. | 510/175 |
| 7,144,848 | B2 * | 12/2006 | Zhou et al. ............. | 510/175 |
| 7,252,718 | B2 * | 8/2007 | Carter ............. | 134/26 |
| 2004/0112409 | A1 * | 6/2004 | Schilling ............. | 134/26 |
| 2004/0147420 | A1 * | 7/2004 | Zhou et al. ............. | 510/176 |
| 2006/0000492 | A1 * | 1/2006 | Carter ............. | 134/26 |
| 2006/0051969 | A1 | 3/2006 | Nakajima et al. | |
| 2006/0175297 | A1 * | 8/2006 | Yun et al. ............. | 216/88 |

FOREIGN PATENT DOCUMENTS

| | | |
|---|---|---|
| JP | 6-45296 | 2/1994 |
| JP | 10-303197 | 11/1998 |
| JP | 2001-168077 | 6/2001 |
| JP | 2002-275667 | 9/2002 |
| JP | 2003-5388 | 1/2003 |

OTHER PUBLICATIONS

Notice of Reasons for Rejection issued by the Japanese Patent Office on Jun. 1, 2010, for Japanese Patent Application No. 2005-317704, and English-language translation thereof.

* cited by examiner

*Primary Examiner*—Allan Olsen
(74) *Attorney, Agent, or Firm*—Finnegan, Henderson, Farabow, Garrett & Dunner, L.L.P.

(57) ABSTRACT

A method of manufacturing a semiconductor device includes subjecting a semiconductor substrate having an aluminum film formed thereabove to a processing to at least partially expose a surface of the aluminum film, and carrying out a surface processing to remove an after-processing residue that remains on the exposed surface of the aluminum film. The surface processing includes treating the exposed surface of the aluminum film with a first liquid chemical containing an anion component and then with an alkaline, second liquid chemical.

18 Claims, 3 Drawing Sheets

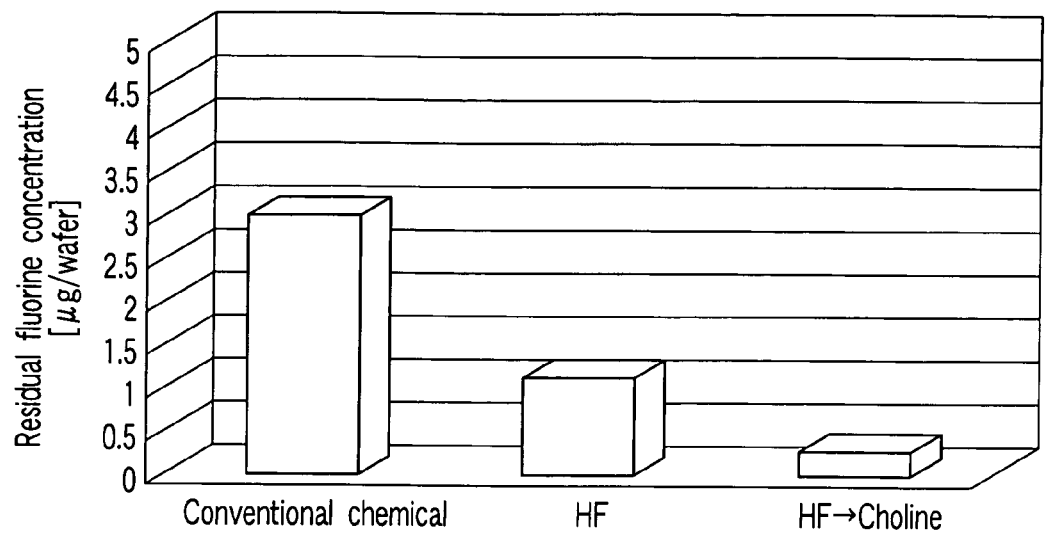
F I G. 4
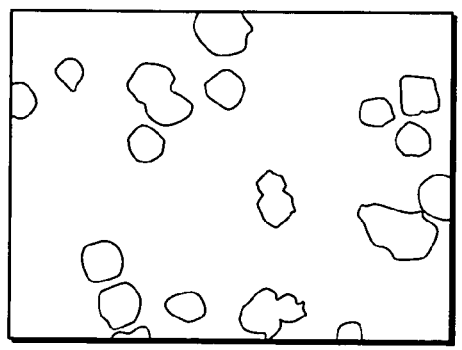
F I G. 5A
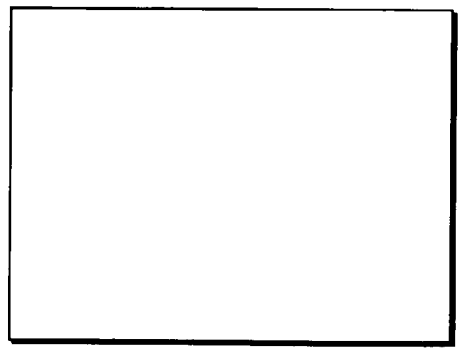
F I G. 5B

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2005-317704, field Oct. 31, 2005, the entire contents of which are incorporated herein by reference.

BACKGROUND OF THE INVENTION

1. Field of the Invention

The present invention relates to a method of manufacturing a semiconductor device, and particularly to a method of manufacturing a semiconductor device comprising surface processing of an aluminum film.

2. Description of the Related Art

When a semiconductor wafer having an aluminum film formed thereon is processed so as to expose the aluminum, processing reaction products, resist residues, re-deposited substances and the like remain on the aluminum film.

For example, when an aluminum film formed on a barrier metal film is patterned together with the barrier metal film, using a resist mask, by means of an etching gas comprising a fluorocarbon-based gas or the like, and then the resist mask is removed by dry etching, carbon-based residues derived from the resist remain on the upper surface of the resulting aluminum pattern. In addition, reaction by-products of the aluminum with the etching gas such as a fluorocarbon-based gas are deposited on the side wall surface of the aluminum pattern. Further, silicon-based substances derived from the underlying silicon oxide are also deposited on the side wall surface.

Further, when a contact hole is formed in a silicon oxide insulation film or a silicon nitride insulation film formed on an aluminum wiring layer to partially expose the aluminum wiring layer by etching with a gas comprising a fluorocarbon-based gas, reaction by-products of the aluminum with the fluorocarbon or the like are deposited on the surface of the exposed aluminum wiring layer. In addition, silicon-based reaction by-products derived from the silicon oxide insulation film are also deposited.

These residues (after-processing residues) that remain on the aluminum film after processing often lower the performance of the finally obtained semiconductor device if they are not removed.

Conventionally, organic amine-based chemicals have been used to remove the after-processing residues on the aluminum film, but their removing power is poor. Recently, acid-based or organic solvent/fluorine mixture-based chemicals have been used (see, for example, Jpn. Pat. Appln. KOKAI Publication Nos. 6-45296 and 10-303197).

However, anions (e.g., $F^-$, $Cl^-$, $Br^-$, $I^-$, $So_x^-$, $NO_x^-$, and $PO_x^-$) that are acidic components in these chemicals or organic acid anions (e.g., carboxyl group (—$COO^-$), sulfone group (—$SO_x^-$), and nitro group (—$NO_x^-$)) remain on an aluminum surface after processing, causing aluminum corrosion after processing.

BRIEF SUMMARY OF THE INVENTION

According to one aspect of the present invention, there is provided a method of manufacturing a semiconductor device, comprising: subjecting a semiconductor substrate having an aluminum film formed thereabove to a processing to at least partially expose a surface of the aluminum film; and carrying out a surface treatment to remove an after-processing residue that remains on the exposed surface of the aluminum film, wherein the surface treatment comprises treating the exposed surface of the aluminum film with a first liquid chemical containing an anion component and then with an alkaline, second liquid chemical.

BRIEF DESCRIPTION OF THE SEVERAL VIEWS OF THE DRAWING

FIG. 4 is a graph illustrating an amount of fluorine that remains on an aluminum film after a variety of surface processing operations; and FIGS. 5A and 5B are traced drawings of optical micrograms of aluminum films obtained after a variety of surface processing operations.

DETAILED DESCRIPTION OF THE INVENTION

Figure 1:
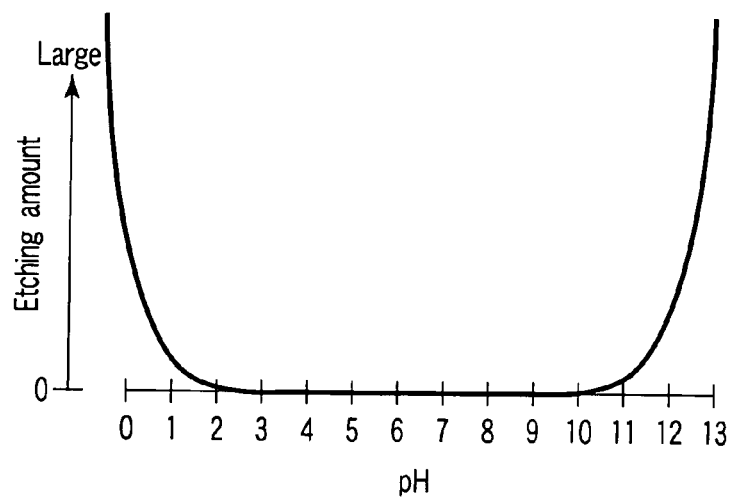
FIG. 1 is a graph illustrating a pH dependency of a dissolving property (etching property) of aluminum.

A method of manufacturing a semiconductor device according to one aspect of the present invention comprises subjecting a semiconductor substrate having an aluminum film formed thereabove to a processing to at least partially expose the surface of the aluminum film, and carrying out a surface treatment to remove an after-processing residue that remains on the exposed surface of the aluminum film.

The processing of exposing at least partially the surface of the aluminum film includes both of: patterning an aluminum film by means of dry etching using a resist mask and then removing the resist mask by means of dry etching; and forming a contact hole in an insulation film (e.g., silicon oxide film or silicon nitride film) formed on an aluminum wiring layer to partially expose the aluminum wiring layer. Usually, a gas comprising a fluorocarbon (e.g., $CHF_3$ or $C_4F_8$), HCl, HBr or a mixture thereof can be used for patterning the aluminum film and forming the contact hole. For dry etching of the resist mask, ashing with a gas comprising $O_2$, $N_2$, $H_2$, He or a mixture thereof can be used. Etching with a gas comprising a fluorocarbon or the like can be combined with the ashing.

At the time of the patterning, the aluminum film may be formed on a barrier metal (e.g., Ti, TiN, Ta, TaN or WN), and further, the barrier metal may be formed on the aluminum film. In these cases as well, the aluminum film is exposed at the side face thereof by the patterning.

In one embodiment of the present invention, after the processing of exposing the aluminum film has been carried out, an after-processing residue that remains on a surface of the exposed aluminum film is first treated with a liquid chemical containing anions (first chemical treatment). Usually, the liquid chemical containing anions is often an acid. Such an acidic chemical includes an inorganic acid (e.g., hydrohalic acid (such as hydrofluoric acid, hydrochloric acid, hydrobromic acid, or hydroiodic acid), sulfuric acid, nitric acid, sulfurous acid, hydrocyanic acid, carbonic acid, hydrocarbonic acid, hydrosulfuric acid, or phosphoric acid), and an organic acid (e.g., a carboxylic acid (such as citric acid, oxalic acid, acetic acid, maleic acid, fumaric acid, formic acid, benzoic acid, phthalic acid, terephthalic acid, salicylic acid, lactic acid, malic acid, tartaric acid, or propionic acid), a sulfonic acid (such as benzenesulfonic acid or toluenesulfonic acid or the like), or an amino acid (such as glycine, alanine, serine, cystine, lysine, phenylalanine, tyrosine, or glutamic acid)). Salts of these acids can also be used. Examples of such a salt include ammonium fluoride ($NH_4F$), ammonium chloride ($NH_4Cl$), ammonium bromide ($NH_4Br$), ammonium iodide ($NH_4I$), ammonium sulfate (($NH_4$)$_2SO_4$), ammonium nitrate (($NH_4$)$_2NO_3$), ammonium nitrite (($NH_4$)$_2NO_2$), ammonium cyanide ($NH_4CN$), ammonium carbonate (($NH_4$)$_2CO_3$), ammonium hydrocarbonate (($NH_4$)$_2CO_2$), ammonium sulfide (($NH_4$)$_2S$), ammonium phosphate (($NH_4$)$_3PO_4$), ammonium citrate, ammonium oxalate, ammonium acetate, ammonium maleate, ammonium fumarate, ammonium formate, ammonium benzoate, ammonium phthalate, ammonium terephthalate, ammonium salicylate, ammonium lactate, ammonium malate, ammonium tartrate, ammonium propionate, ammonium benzenesulfonate, and ammonium toluenesulfonate. TMAH salts, choline salts, TEAH salts and TEMAH salts of the organic acid may also be used. A mixed liquid containing such an acid or a liquid containing such a salt of an acid may be neutral to alkaline, but contains anions derived from the acid. In other words, the anion-containing chemical may be any chemical that contains anions. A chemical containing particularly fluorine ions among halogen ions, such as hydrofluoric acid, slightly etches the surface of the aluminum film, and thus is more effective in removing the after-processing residues. The first chemical treatment can be carried out by contacting the anion-containing chemical with the aluminum film for, e.g., 5 to 900 seconds. The treating temperature is not particularly limited, but is usually 20° C. to 40° C.

Although the after-processing residues can be removed by the above first treatment, the anions derived from the chemical used for processing remain on the aluminum film, and these anions cause aluminum corrosion. Thus, the residual anions are removed by treatment with an alkaline liquid chemical (second chemical treatment). Any alkaline liquid chemical may be used. However, it is preferable that an alkaline liquid chemical do not contain any metal which may adversely affect a semiconductor device to be manufactured and do not contain any halogen. Such an alkaline liquid chemical includes, for example, an aqueous solution of ammonium hydroxide, choline (2-hydroxyethyltrimethylammonium hydroxide); tetramethylammonium hydroxide (TMAH); tetraethylammonium hydroxide (TEAH) or triethylmonomethylammonium hydroxide (TEMAH). The second chemical treatment can be carried out by contacting the alkaline liquid chemical with the aluminum film for, e.g., 1 to 300 seconds. The treating temperature is not particularly limited, but is usually 20° C. to 40° C.

Note that aluminum shows a dissolving (etching) behavior that is different from copper. That is, copper is insoluble in an acid that is weak in oxidizing power, having an oxidation-reduction potential of less than 0.5V, and is insoluble in an alkali. Examples of an acid having an oxidizing power of dissolving copper are a concentrated sulfuric acid, a concentrated nitric acid, or a mixture of hydrochloric acid and hydrogen peroxide. In contrast, aluminum is dissolved under high pH or under low pH. Under low pH, aluminum is soluble in an acid without an oxidizing power. In addition, when aluminum is treated with an acid having an oxidizing power, aluminum forms aluminum oxide (alumina) film on the surface, and thus becomes resistant to etching.

FIG. 1 is a graph illustrating a pH dependency of dissolving property (etching property) of aluminum, generally known in the art. According to this graph, it is seen that an etching amount of aluminum is suppressed to some extent in the pH range of 1 to 11, whereas an etching amount of aluminum increases in the case where a pH value is less than 1 or greater than 11. Therefore, it is desirable that a chemical treatment be carried out using a chemical whose pH is 1 to 11. It is further desirable that such chemical treatment be carried out using a chemical whose pH is 2 to 10. For example, treatment using a chemical containing anion components can be carried out using a chemical whose pH is 1 to 7 (preferably, pH is 2 to 7), and then, the subsequent treatment using an alkaline chemical can be carried out using an alkaline chemical whose pH is greater than 7 and equal to or smaller than 11 (preferably, pH is greater than 7 and equal to or smaller than 10). However, as is confirmed in Example 1 described later, an effect of reducing the remaining anions by the second chemical treatment can be sufficiently obtained within 5 seconds in most cases. Even if pH of an alkaline chemical exceeds 11, no serious problem occurs because a processing time is very short.

FIGS. 2A to 2D are schematic cross-sectional views illustrating a method of manufacturing a semiconductor device according to a first embodiment of the present invention. Here, the first chemical treatment and second chemical treatment are applied in forming a wiring layer including an aluminum film.

Figure 2A:
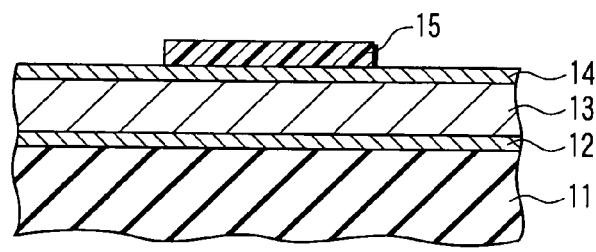
FIGS. 2A to 2D are schematic cross-sectional views illustrating a method of manufacturing a semiconductor device according to a first embodiment of the present invention.

First, as shown in FIG. 2A, on an insulation film 11 (for example, silicon oxide film or silicon nitride film) formed above a silicon substrate (not shown), a lower barrier metal film 12 (e.g., Ti, TiN, Ta, TaN or WN), an aluminum film 13, and an upper barrier metal film 14 (e.g., Ti, TiN, Ta, TaN or WN) are sequentially formed. On the upper barrier metal film 14, a resist is coated and patterned, thereby forming a resist pattern 15.

Figure 2B:
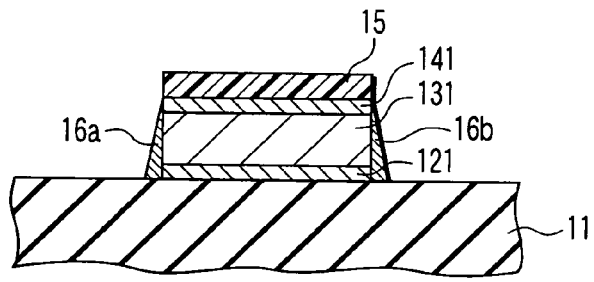

Next, as shown in FIG. 2B, with the resist pattern 15 used as a mask, the upper barrier metal film 14, the aluminum film 13, and the lower barrier metal film 12 are patterned by dry etching using a gas comprising fluorocarbon or the like, thereby forming a wiring pattern consisting of a residual upper barrier metal film 141, a residual aluminum film 131, and a residual lower barrier metal film 121. Each of the side surfaces of the residual upper barrier metal film 141, aluminum film 131, and lower barrier metal film 121 is exposed. Aluminum-based residues 16a, 16b derived from the reaction between the aluminum and the fluorocarbon are deposited on these side surfaces.

Figure 2C:
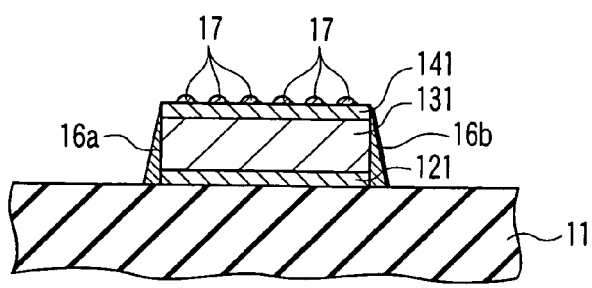

Thereafter, as shown in FIG. 2C, the resist pattern 15 used as a mask is removed by ashing. By this ashing, a carbon-based residue 17 derived from the reaction between the resist pattern and oxygen is deposited on the upper barrier metal film 141 and the like.

Figure 2D:
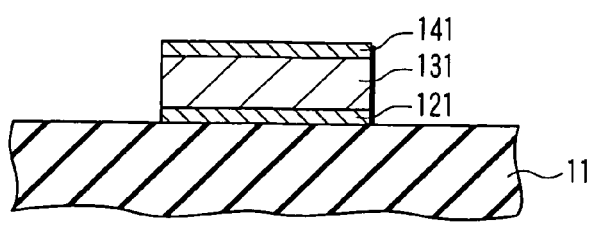

Next, the above first chemical treatment and second chemical treatment are sequentially carried out with respect to the wiring pattern shown in FIG. 2C to obtain a wiring pattern from which the processing residue has been removed, as shown in FIG. 2D.

In the first embodiment described above, the upper barrier metal film 14 can be omitted.

Figure 3A:
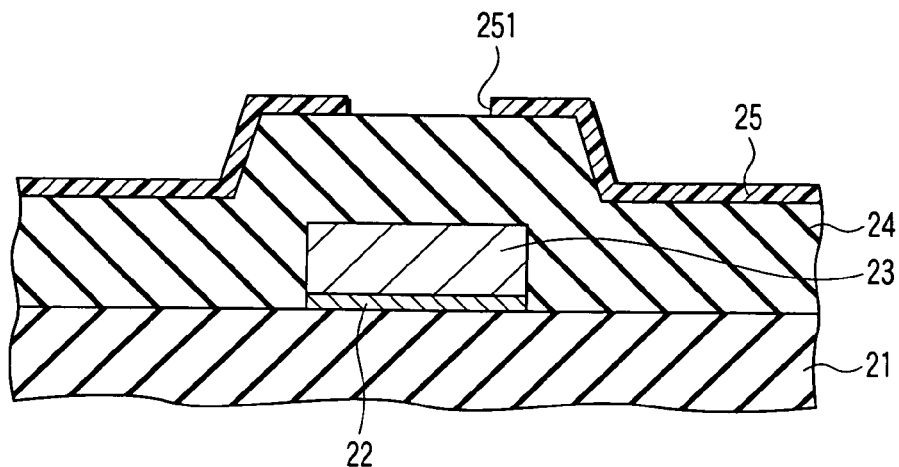
FIGS. 3A to 3C are schematic cross-sectional views illustrating a method for manufacturing a semiconductor device according to a second embodiment of the present invention.
Figure 3B:
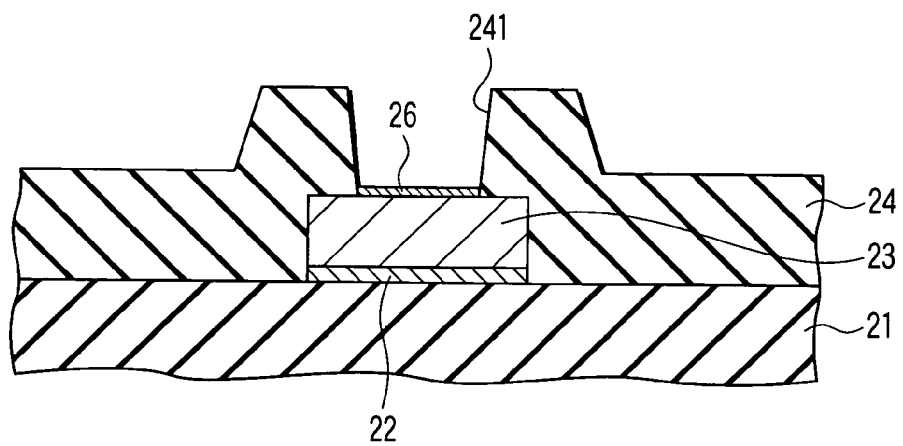
Figure 3C:
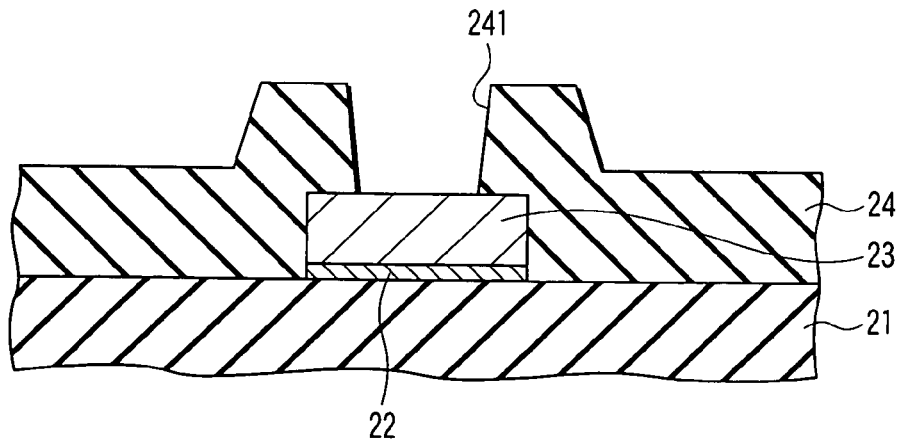

FIGS. 3A to 3C are schematic cross-sectional views illustrating a method of manufacturing a semiconductor device according to a second embodiment of the present invention. Here, the above first chemical treatment and second chemical treatment are applied in forming a contact hole in an insulation film formed to cover an aluminum-based wiring layer, to partially expose the aluminum-based wiring layer.

As shown in FIG. 3A, on an insulation film 21 (for example, a silicon oxide film or a silicon nitride film) formed on a silicon substrate (not shown), a wiring layer consisting of a lower barrier metal film 22 (e.g., Ti, TiN, Ta, TaN or WN) and an aluminum film 23 formed thereon is formed. For example, the technique in the above first embodiment can be applied in forming this wiring layer. After forming the wiring layer, a second insulation film 24 (for example, a silicon oxide film or a silicon nitride film) is formed to cover this wiring layer. After coating a resist layer 25 on the insulation film 24, a hole 251 corresponding to a contact hole is formed therein. The second insulation film can also be formed by laminating a silicon oxide film and a silicon nitride film, for example.

Next, as shown in FIG. 3B, with the resist layer 25 having the hole 251 used as a mask, a contact hole 241 partially exposing the aluminum film 23 is formed in the second insulation film 24 by dry etching using a gas comprising a fluorocarbon-based gas, HCl, HBr or a mixture thereof. Thereafter, the resist layer 25 is removed. The surface of the aluminum film 23 is partially exposed by forming this contact hole 241. An aluminum-based residue 26 derived from the reaction of the gas such as a fluorocarbon gas, HCl and/or HBr with the aluminum is deposited on the exposed surface of the aluminum film 23. Although not shown, a silicon-based residue derived from the silicon oxide serving as the second insulation film may also be deposited on the side wall of the second insulation film that defines the contact hole 241.

Thereafter, the first chemical treatment and second chemical treatment described above are carried out with respect to the exposed surface of the aluminum film 23, thereby obtaining a clean aluminum surface from which the residue 26 has been removed, as shown in FIG. 3C.

The present invention can be applied not only to the manufacture of a semiconductor device, but also to the manufacture of FPD or HDD comprising a substrate and a wiring layer formed thereabove.

The present invention will be further described by way of Examples below.

Example 1

An aluminum film formed on a silicon wafer having a diameter of 300 mm was treated with (1) a typical conventional chemical (ammonium fluoride dissolved in an organic solvent) for 10 minutes; (2) a hydrofluoric acid diluted to about 0.05% by weight for 20 seconds; or (3) about 0.05% by weight hydrofluoric acid for 20 seconds and then about 0.1% by weight aqueous choline solution for 5 seconds (HF→choline). Then, the residual fluorine on each of the surfaces of the aluminum films thus treated was extracted with deionized water, and was analyzed by ion chromatography. The results are shown in FIG. 4. The treating time for each chemical was determined depending on a time period for which the processing residues produced after the aluminum has been processed by RIE can be removed.

From the results shown in FIG. 4, it is seen that the residual fluorine of substantially 3 μg per wafer exists after the treatment with the conventional chemical. In the case of the treatment only with hydrofluoric acid, it is seen that fluorine of substantially 1 μg per wafer remains. In contrast, in the case where the choline treatment has been carried out after the hydrofluoric acid treatment, it is seen that the residual fluorine has been remarkably reduced to about 0.3 μg per wafer.

Example 2

As has been described with respect to FIGS. 3A to 3C, the contact hole 241 was formed in the insulation layer 24 (silicon oxide layer), and the exposed surface of the aluminum film 23 was treated with the conventional chemical or with HF→choline, as described in Example 1. After the treatment, the aluminum film 23 was allowed to stand for 5 days and the surface state of the aluminum film 23 was observed by an optical microscope, and then, a microgram thereof was traced (FIGS. 5A and 5B). FIG. 5A relates the treatment with the conventional chemical. As shown in the figure, it was observed that corrosion occurred on an aluminum surface (indicated by the closed curve). In contrast, FIG. 5B relates to the treatment with HF→choline. In this case, it was observed that the aluminum corrosion was suppressed, and an excellent surface state was maintained. This is expected to be because, if a large amount of fluorine remains on an aluminum surface, aluminum corrosion caused by the residue is prone to be induced, from the result shown in Example 1. Under a condition that an amount of the residual fluorine was reduced carrying out the HF→choline treatment, aluminum corrosion was successfully suppressed.

As has been described above, according to the present invention, the after-processing residues can be effectively removed from an aluminum film surface, thus making it possible to manufacture a semiconductor device without lowering of performance caused by the after-processing residue.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
   subjecting a semiconductor substrate having an aluminum film formed thereabove to a processing to at least partially expose a surface of the aluminum film; and
   carrying out a surface processing to remove an after-processing residue that remains on the exposed surface of the aluminum film,
   wherein the surface processing comprises treating the exposed surface of the aluminum film with a first liquid chemical containing an anion component and then with an alkaline, second liquid chemical, wherein the second liquid chemical is free of metals and of halogens.

2. The method according to claim 1, wherein a pH value of the first liquid chemical is in a range of 1 to 7.

3. The method according to claim 1, wherein the exposed surface of the aluminum film is contacted with the first liquid chemical at a temperature of 20 to 40° C. for 5 to 900 seconds.

4. The method according to claim 1, wherein a pH value of the second liquid chemical is larger than 7, and 11 or less.

5. The method according to claim 1, wherein the second liquid chemical comprises an alkali selected from the group consisting of ammonium hydroxide, choline, tetramethylammonium hydroxide, tetraethylammonium hydroxide, triethylmonomethylammonium hydroxide, and a combination thereof.

6. The method according to claim 1, wherein the exposed surface of the aluminum film is contacted with the second liquid chemical at 20 to 40° C. for 1 to 300 seconds.

7. The method according to claim 1, wherein the processing to at least partially expose a surface of the aluminum film comprises patterning the aluminum film using a resist mask by means of dry etching and removing the resist mask by means of dry etching.

8. The method according to claim 7, wherein the patterning by means of dry etching is carried out by using a gas comprising a fluorocarbon, HCl, HBr or a mixture thereof.

9. The method according to claim 7, wherein the removing the resist mask by means of dry etching is carried out by using a gas comprising oxygen, nitrogen, hydrogen, helium or a mixture thereof.

10. The method according to claim 7, wherein a pH value of the first liquid chemical is 1 to 7, and a pH value of the second liquid chemical is larger than 7 and 11 or less.

11. The method according to claim 1, wherein the processing to at least partially expose a surface of the aluminum film comprises forming an insulation film on the aluminum film, and forming a contact hole in the insulation film to partially expose a surface of the aluminum film.

12. The method according to claim 11, wherein the contact hole is formed by means of dry etching using a gas comprising a fluorocarbon.

13. The method according to claim 11, wherein a pH value of the first liquid chemical is 1 to 7, and a pH value of the second liquid chemical is larger than 7 and 11 or less.

14. The method according to claim 1, wherein the first liquid chemical comprises an inorganic acid or a salt thereof, or an organic acid or a salt thereof.

15. The method according to claim 14, wherein the first liquid chemical comprises an inorganic acid or a salt thereof, and the inorganic acid is selected from the group consisting of a hydrohalic acid, sulfuric acid, nitric acid, sulfurous acid, hydrocyanic acid, carbonic acid, hydrocarbonic acid, hydrosulfuric acid, phosphoric acid and a combination thereof.

16. The method according to claim 14, wherein the first liquid chemical comprises an organic acid or a salt thereof, and the organic acid is selected from the group consisting of a carboxylic acid, a sulfonic acid, an amino acid and a combination thereof.

17. The method according to claim 14, wherein the first liquid chemical comprises a halogen.

18. The method according to claim 17, wherein the first liquid chemical comprises fluorine.

* * * * *